United States Patent [19]

Cuzzo

[11] B 3,916,179

[45] Oct. 28, 1975

[54] ELECTRONIC INTEGRATOR WITH VOLTAGE CONTROLLED TIME CONSTANT

[75] Inventor: John Cuzzo, Pittsburgh, Pa.

[73] Assignee: Westinghouse Electric Corporation, Pittsburgh, Pa.

[22] Filed: Sept. 13, 1972

[21] Appl. No.: 288,627

[44] Published under the Trial Voluntary Protest Program on January 28, 1975 as document no. B 288,627.

[52] U.S. Cl........ 235/183; 235/92 NT; 150/151.51; 340/347 DA; 340/347 NT

[51] Int. Cl.²........................................... G06G 7/18

[58] Field of Search............... 340/347 NT, 347 AD; 307/228; 235/150.51, 183

[56] References Cited

UNITED STATES PATENTS

| | | | |
|---|---|---|---|
| 3,313,924 | 4/1967 | Schultz | 340/347 AD |
| 3,389,271 | 6/1968 | Gray | 340/347 NT |
| 3,404,857 | 10/1968 | Tippetts | 340/347 NT |
| 3,480,769 | 11/1969 | Gilbert | 235/183 |
| 3,504,267 | 3/1970 | James | 340/347 NT |
| 3,505,673 | 4/1970 | James | 340/347 AD |
| 3,550,018 | 12/1970 | James | 340/347 NT |
| 3,614,633 | 10/1971 | Yalshev et al. | 235/183 |

*Primary Examiner*—Felix D. Gruber
*Attorney, Agent, or Firm*—E. F. Possessky

[57] ABSTRACT

A method and apparatus for controlling the time constant of an integrator linearly as a function of a control voltage. A ramp signal having a negative slope proportional to the magnitude of the applied signal generates a pulse each time it decays to a predetermined level. An accumulated count of the pulses is transformed into an analog output signal by a digital-to-analog converter. Each time a pulse is generated the ramp signal is reset to a level determined by the control voltage, hence, the time constant of the integrator is a linear function of the magnitude of the control voltage.

10 Claims, 3 Drawing Figures

ELECTRONIC INTEGRATOR WITH VOLTAGE CONTROLLED TIME CONSTANT

CROSS-REFERENCE TO RELATED APPLICATIONS

1. The commonly owned application of James Franklin Sutherland entitled "DIGITAL-TO-ANALOG CONVERSION APPARATUS AND METHOD", Ser. No. 200,367 filed Nov. 19, 1971 now Pat. No. 3,754,233.

2. The commonly owned application of James Tenant Carlton entitled "DIGITAL INTEGRATION APPARATUS AND METHOD", Ser. No. 268,951 filed July 5, 1972 now Pat. No. 3,786,491.

BACKGROUND OF THE INVENTION

1. Field of the Invention

This invention relates to electronic integrating circuits and, more particularly, to methods and apparatus for controlling the time constants of such circuits.

2. Prior Art

Electronic integrating circuits may employ either analog or digital techniques to generate an output signal which is the integral of an applied signal. The analog integrators utilize a capacitor in the feedback loop of either an AC or DC amplifier. The time constant of such integrators, which is defined as the interval required for the output of the integrator to reach $1/e$ or 0.63 times its final value for a unit pulse input, is determined by the product of the capacitance of the capacitor and the resistance of an input resistor. In order to vary the time constant, either the resistance of the input resistor, the capacitance of the feedback capacitor, or both, may be varied. The resistive component of the time constant can be varied relatively easily by use of a potentiometer. It is not practical, however, to vary the time constant of an integrator over an extended range through variation of the resistance alone. The normal manner of varying the capacitive component of the integrator time constant is to selectively insert capacitors of varying capacitance into the amplifier feedback loop. This technique requires discrete switching operations which introduce discontinuities into the integrator output signal. As noted above, it also requires mechanical manipulation of either the potentiometer, the capacitance selection means, or both.

Lately, digital integration techniques have been applied to electronic integrating circuits in a great many applications. In the digital integrator disclosed in the commonly owned application reference 2 above, the analog voltage signal to be integrated is applied to a voltage controlled clock which generates pulses at a rate proportional to the magnitude of the applied signal. A count of these pulses is accumulated in a reversible digital counter, and the stored count is converted to an output signal by a digital-to-analog converter. The time constant of the integrator is varied either by dividing down the pulses generated by the clock with a count divider, and/or scaling down of the signal applied to the clock with a potentiometer. Both techniques require mechanical manipulation of a component, the first through rotation of the selector switch, and the second through adjustment of a knob or slider on the potentiometer.

SUMMARY OF THE INVENTION

According to the invention means are provided for varying the time constant of an electronic integrator linearly as a function of an adjustable control signal. In the preferred embodiment, the time constant is continuously variable inversely as a function of the control voltage.

As applied to a digital integrator wherein pulses generated by a voltage to frequency converter at a rate proportional to the magnitude of the applied signal are accumulated in a digital counter and converted to an analog signal by a digital to analog converter, the time constant of the integrator is varied by altering the ratio of the pulses generated to the magnitude of the applied signal. In the preferred embodiment of the invention, the voltage-to-frequency converter includes means for generating a ramp signal having a negative slope proportional to the magnitude of the applied signal and means for generating a pulse each time the ramp signal decays to a predetermined level. The time constant of this combination can be varied as a function of the control voltage by resetting the ramp signal each time a pulse is generated to a level proportional to the magnitude of the control voltage.

The pulse generating means may comprise a comparator for comparing the magnitude of the ramp signal with a reference signal. The comparator generates a digital ZERO output when the magnitude of the ramp signal exceeds the reference signal and a digital ONE output when the reference signal exceeds the ramp signal. Thus, the output of the comparator goes to a digital ONE when the ramp signal decays to a level substantially equal to the level of the reference signal. Reset means responsive to the digital ONE output of the comparator then increases the magnitude of the ramp signal. By applying the control voltage to the comparator as the reference signal during this interval, the magnitude of the ramp signal increases until it is substantially equal to the control voltage at which time the output of the comparator switches to ZERO and the ramp signal begins to decay until the output of the comparator again goes to ONE to generate another pulse.

Preferably, the ZERO output of the comparator is applied as the reference signal while the ramp signal is decaying. The transfer between the control voltage and the ZERO output of the comparator as the reference signal may be accomplished by appling the control signal across a voltage divider having its tap point connected to supply the reference signal to the comparator. The tap point is also connected to the output of the comparator through a blocking diode connected in such a manner as to prevent the magnitude of the reference signal applied to the comparator from exceeding the output of the comparator. This novel combination provides a simple yet effective means for limiting the magnitude of the reference signal, and hence the time constant of the integrator.

BRIEF DESCRIPTION OF THE DRAWINGS

An understanding of the invention can be gained from a reading of the following description taken in conjuction with the accompanying drawings, in which.

DESCRIPTION OF THE PREFERRED EMBODIMENT

Figures 1, 2, 3:
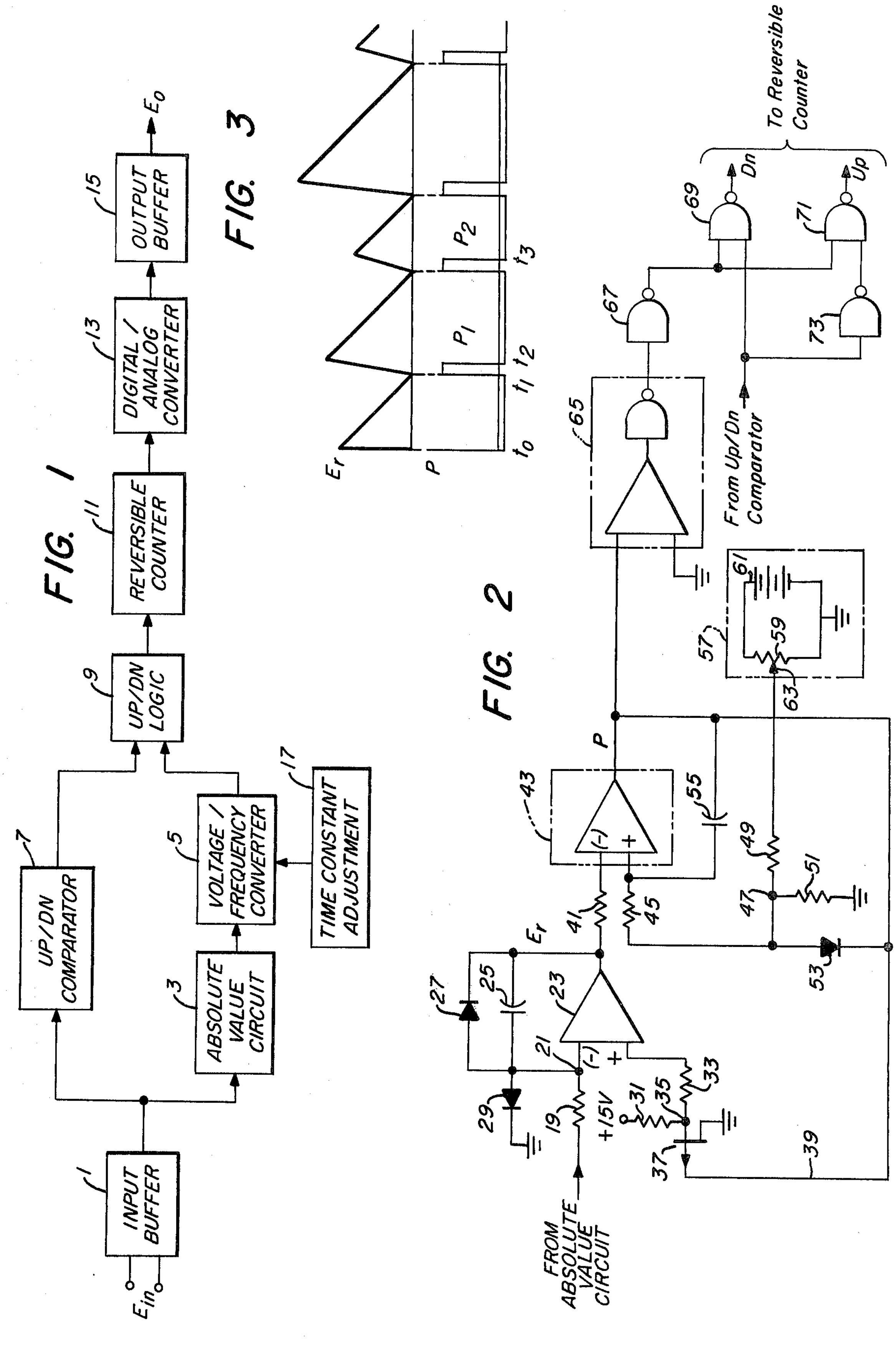
FIG. 1 is a block diagram of a digital integrator incorporating the invention.
FIG. 2 is a schematic circuit diagram of a portion of the integrator shown in FIG. 1.
FIG. 3 is a composite waveform diagram of selected signals generated in the circuit of FIG. 2.

FIG. 1 illustrates in block diagram form a digital integrator in which an input buffer 1 converts a differential applied signal, $E_{in}$, to a single-ended bipolar signal. This signal is applied through absolute value circuit 3 to a voltage to frequency converter 5 which generates pulses at a rate proportional to the magnitude of $E_{in}$. These pulses along with a direction signal generated by an up/down comparator 7 which is responsive to the sense of the bipolar signal generated by the input buffer 1, are applied to the up/down logic 9. The up/down logic 9 applies the pulses generated by the voltage-to-frequency converter 5 to either the count-up or count-down input of reversible counter 11 depending upon the sense of the applied signal as determined by the up/down comparator 7.

The count stored in the reversible counter 11 is converted to an analog voltage signal by digital-to-analog converter 13 such as that disclosed in reference 1 above. The output of the digital-to-analog converter 13 may be applied to an output buffer 15 which will generate a bipolar output signal $E_0$.

This type of digital integrator was disclosed and claimed in the copending application reference 2 above. However, in place of the count divider and the amplitude adjustment in the absolute value circuit utilized in the previously described integrator to vary the time constant, linear voltage controlled time constant adjustment is provided by the block 17 which operates on the voltage-to-frequency converter 5.

A schematic circuit diagram of the voltage-to-frequency converter 5, the up/down logic 9 and the time constant adjustment 17 is illustrated in FIG. 2. The positive signal from the absolute value circuit proportional to the signal $E_{in}$ to be integrated is applied through resistor 19 to the summing junction 21 of the operational amplifier 23. A suitable operational amplifier 23 is a type LM 31OAH high-speed amplifier manufactured by National Semiconductor Corporation, of Santa Clara, Calif. A capacitor 25 connected in the feedback circuit of the amplifier 23 is shunted by a diode 27 having its anode connected to the summing junction 21. Another diode 29 is connected between the summing junction 21 and ground.

The non-inverting input of the amplifier 23 is connected through resistors 31 and 33 to a +15 volt supply. The junction 35 between the resistors 31 and 33 is connected to the drain electrode of a p-junction fet 37 such as a type 2N5116. The source electrode of fet 37 is connected to ground and the gate electrode is connected to lead 39.

The output of the amplifier 23 is connected through resistor 41 to the inverting input of comparator 43. The non-inverting input of comparator 43 is connected through resistor 45 to a tap point 47 of a voltage divider comprising resistors 49 and 51. The output of the comparator 43 is connected to the cathode of a diode 53 connected between the comparator output and the tap point 47 of the voltage divider, and through lead 39 to the gate electrode of fet 37. A capacitor 55 is connected between the non-inverting input and the output of the comparator. The comparator 43 generates a −0.5 volt output signal if the voltage at the output of amplifier 23 applied to the inverting input of the comparator 43 exceeds the voltage at the tap point 47 of the voltage divider applied to the non-inverting input by at least 1 millivolt. Otherwise, the output of the comparator is approximately +4 volts. The −0.5 volt output of the comparator 43 may be considered a digital ZERO signal while the +4 volt output may be considered a digital ONE signal. Thus, the comparator will generate a digital ZERO signal if the output voltage of amplifier 23 exceeds the voltage at the tap point 47, and a digital ONE signal if the signal at the tap point 47 exceeds the output of the amplifier. A suitable comparator 43 is type 711 manufactured by Fairchild Semiconductor, Inc. of Mountainview, Calif.

A control voltage is applied across the voltage divider made up of the resistors 49 and 51 by the voltage source indicated generally by the reference character 57. For purposes of illustration, the voltage source 57 includes a potentiometer 59 connected across a battery 61 having its negative terminal grounded. The slider 63 on the potentiometer 59 permits continuous variation of the control voltage applied to the voltage divider. The control voltage may be provided by any other type of voltage generating device, either manual or automatic.

The pulses P generated by the comparator 43 are applied to the non-inverting input of line receiver 65. A suitable line receiver is type 9622 manufactured by Fairchild Semiconductor, Inc. of Mountainview, Calif. These devices have a threshold of 1.5 volts. A positive voltage of more than 1.5 volts applied to the positive input will cause the output to go to ZERO. Otherwise the output will be a digital ONE. Thus, it can be seen that the 4-volt signal generated by the comparator 43 will cause the output of the line receiver 65 to go to ZERO while the −0.5 volt output of the comparator will cause the line receiver to generate a digital ONE signal.

The output of the line receiver 65 is inverted by the NAND element 67 and applied to the input of NAND elements 69 and 71. A NAND element is a well-known logic circuit which generates a digital ONE output signal unless all of its inputs are digital ONE signals. Thus, a NAND element such as NAND 67 with only one input generates a ZERO signal if a ONE is applied to its input or a ONE in response to a ZERO input and is therefore also referred to as an inverter.

A direction signal from the up/down comparator 7 is applied directly to an additional input to the NAND 69 and, through inverter 73, to NAND element 71. The output of NAND element 69 is applied to the count-down input of reversible counter 11 while the output of NAND 71 is connected to the count-up input of the counter.

The circuit of FIG. 2 operates in the following manner. If it is assumed that $E_{in}$, the signal to be integrated, is positive, the digital ZERO signal generated by the up/down comparator will disable NAND 69 and enable NAND 71 through the inverter 73. If the instant when capacitor 25 is fully charged is considered, the positive voltage $E_r$, generated at the output of the amplifier 23, will produce a digital ZERO signal at the output of the comparator 43. This digital ZERO signal will be applied to the NANDs 69 and 71 through line receiver 65 and inverter 67. Therefore, the outputs of NAND elements 69 and 71 will both be equal to ONE.

As mentioned above, the digital ZERO signal appearing at the output of comparator 43 is actually an approximately −0.5 signal. Due to the forward drop in diode 53, the reference signal applied to the non-inverting input of the comparator 43 will be approximately zero volts. The −0.5 volt output of the comparator 43 will also turn on the fet 37 to ground junction 35 connected to the non-inverting input of the amplifier 23.

Under the assumed conditions, the positive signal from the absolute value circuit which is equal in magnitude to the signal to be integrated, will tend to drive the output of the amplifier 23 negative thereby discharging the capacitor 25. The rate of discharge of the capacitor is a function of the magnitude of the applied signal. Hence, the negative slope of the ramp signal, $E_r$, is also a function of the magnitude of the applied signal. As the ramp signal $E_r$ approaches 0.5 volts, the output of the comparator 43 will switch to a digital ONE. This digital ONE signal will be applied to both NAND elements 69 and 71 through the line receiver 65 and the inverter 67. Since under the assumed conditions the other input of the NAND element 71 is also equal to ONE, its output will go to ZERO to apply a counting pulse to the count-up input of the reversible counter.

The digital ONE output of the comparator 43 will also reverse bias the fet 37 so that current will be applied to the non-inverting input of the amplifier 23 from the 15-volt supply. This will cause the capacitor 25 to charge rapidly through diode 29, thereby rapidly increasing the voltage $E_r$. The approximately 4-volt digital ONE signal generated by the comparator will also permit the voltage on the tap point 47 to rise to a value determined by the setting of the slider 63 on the potentiometer 59 in the control voltage generator 57.

The voltage across the capacitor 25, $E_r$, will continue to rise until it exceeds the voltage on the tap point 47 by approximately 0.5 volts. When this occurs, the output of the comparator 43 will go to ZERO causing the output and NAND element 71 to revert to ONE thereby terminating the pulse to the reversible counter. The fet 37 will again be turned on, by the output by the comparator, to ground the junction 35 and thereby terminate charging of the capacitor 25. The tap point 47 will again be clamped at zero volts and the capacitor will once more discharge at a rate proportional to the magnitude of the applied signal from the absolute value circuit.

It can be seen then that pulses will be continuously generated at a rate proportional to the magnitude of the applied signal. It is evident, however, that the rate at which pulses are generated is also dependent upon the magnitude of the control voltage which determines the voltage at the tap point 47 since the voltage at this junction determines the level to which the capacitor 25 charges following the generation of each pulse. This is illustrated graphically in FIG. 3, which is a plot of the voltage across the capacitor 25, $E_r$, and the pulse signal, P, appearing at the output of the comparator 43. In this figure, it is assumed that the magnitude of the applied signal is constant so that the negative slope of the ramp signal $E_r$ remains constant. At $t_0$, when the capacitor is fully charged, the ramp signal $E_r$ begins to decay at a rate determined by the magnitude of the applied signal. As the ramp signal approaches ZERO at $t_1$, the pulse signal goes to ONE. This causes the ramp signal $E_r$ to increase rapidly until it reaches a value determined by the control voltage at time $t_2$. At this point the pulse signal P goes to ZERO and $E_r$ begins to decay again at the rate determined by the magnitude of the applied signal. If the control voltage is reduced, the ramp signal $E_r$ will not reach as high a level as at $t_3$. If the slope of the ramp signal remains constant, it can be appreciated that the pulses will be generated at a faster rate. On the other hand, if the control voltage is increased so that the voltage $E_r$ reaches a higher level during pulses generated by the comparator, it will take a longer interval for the ramp signals to decay to ZERO at the same rate so that the pulse rate will be reduced. If the interval between pulses is increased for the same level of the applied signal, it will take longer for a count of pulses equivalent to a 1-volt output signal to be accumulated and, hence, the time constant of the integrator has been increased. Since an increase in the magnitude of the control signal causes a decrease in the time constant of the integrator, it can be appreciated that the time constant of the integrator is inversely proportional to the control voltage. It should also be noted that the time constant is linearly related to the control voltage since the discharge portion of $E_r$ is a ramp function and, hence, a doubling of the control voltage will result in a doubling of the interval between pulses.

The magnitude of the reference voltage applied to the non-inverting input of the comparator 43 by the control signal is limited by the diode 53 since this diode will prevent the voltage at the tap point 47 from rising more than 0.5 volts above the voltage generated by the comparator. The capacitor 55 serves to sharpen the switching of the comparator but is small enough so as not to intefere with the selection of the time constant. The diode 27 prevents the ramp signal $E_r$ from going negative.

In summary, an electronic integrator in which the time constant may be linearly controlled as an inverse function of a control voltage has been disclosed. The particular circuits disclosed are meant to be illustrative only as variations within the spirit and the scope of the invention may be made by those skilled in the art.

What is claimed is:

1. In an electronic integrator wherein the integrating means includes a voltage-to-frequency converter for generating pulses at a rate proportional to the magnitude of the applied signal, digital counting means for accumulating a count of the pulses generated by the voltage-to-frequency converter, and digital-to-analog converter means for converting the count accumulated in the digital counting means into an analog output signal, the improvement which comprises voltage controlled means for varying the ratio of the pulse rate of the voltage-to-frequency converter to the magnitude of the applied signal as a function of the magnitude of a variable control voltage.

2. The electronic integrator of claim 1 wherein the voltage-to-frequency converter includes means for generating a ramp signal having a negative slope proportional to the magnitude of said applied signal and means for generating a pulse each time the ramp signal decays to a predetermined level, and wherein the improvement includes reset means for resetting the ramp signal to a level proportional to the magnitude of the variable control voltage each time a pulse is generated.

3. The electronic integrator of claim 2 including means for limiting the magnitude of the ramp signal.

4. The electronic integrator of claim 2 wherein the means for generating pulses includes a comparator for comparing the magnitude of the ramp signal with a reference signal, said comparator having a digital ZERO output when the magnitude of said ramp signal exceeds the reference signal and a digital ONE output when the reference signal exceeds the ramp signal and wherein the reset means includes means responsive to a digital ONE output from the comparator for increasing the magnitude of the ramp signal until it exceeds the magnitude of the reference signal and means for applying a voltage proportional to said variable control voltage to said comparator as the reference signal when the output of the comparator is a digital ONE, whereby the ramp signal is reset to a magnitude proportional to the magnitude of the variable control voltage each time the output of the comparator goes to a digital ONE to generate a pulse.

5. The electronic integrator of claim 4 wherein means are provided for feeding back the output signal of the comparator as the reference signal when the output of the comparator is a digital ZERO.

6. The electronic integrator of claim 5 wherein means for applying the variable control voltage to the comparator as the reference signal when the output of the comparator is a digital ONE and the means for feeding back the output of the comparator as the reference signal when the output of the comparator is a digital ZERO, include a voltage divider across which the control voltage is applied with the tap point of said voltage divider connected to supply the reference signal to said comparator, and a blocking diode connected between the tap point on said voltage divider and the output of the comparator in such a manner as to prevent the voltage on said tap point, and hence the reference signal, from exceeding the magnitude of the output signal of the comparator.

7. The electronic integrator of claim 4 wherein the means for generating a ramp signal includes an analog integrator connected to the comparator with means for integrating the applied signal in a negative sense to drive the output of the integrator down toward the reference signal applied to the comparator when the output of the comparator is digital ZERO, and wherein the reset means includes means for slewing the output of the integrator to the value of the reference signal proportional to the variable control voltage in response to the digital ONE output of the comparator.

8. A method of controlling the time constant of a digital integrator as a function of a variable control voltage comprising the steps of, generating a ramp signal having a negative slope proportional to the magnitude of the signal to be integrated, generating a pulse signal each time the ramp signal decays to a predetermined level, accumulating a count of said pulses, converting said accumulated count to an analog voltage signal, and resetting the ramp signal to a level proportional to said variable control voltage each time a pulse is generated, whereby the time constant of said digital integrator is a function of the magnitude of said variable control voltage.

9. The method of claim 8 including the step of limiting to a predetermined value the level to which said ramp signal may be reset.

10. The method of claim 9 adapted for integrating a bipolar signal wherein the step of accumulating a count of pulses includes the steps of adding the pulses to the accumulated count when the bipolar signal is positive and subtracting the pulses when the bipolar signal is negative.

* * * * *